(12) United States Patent
Hasegawa et al.

(10) Patent No.: US 6,458,205 B1
(45) Date of Patent: Oct. 1, 2002

(54) SILICON EPITAXIAL WAFER AND ITS MANUFACTURING METHOD

(75) Inventors: Koichi Hasegawa, Nigata (JP); Yuji Okubo, Annaka (JP)

(73) Assignees: Shin-Etsu Handotai Co., Ltd., Tokyo (JP); Naoetsudenshikogyo-Kabushikigaisha, Niigata (JP)

( * ) Notice: Subject to any disclaimer, the term of this patent is extended or adjusted under 35 U.S.C. 154(b) by 0 days.

(21) Appl. No.: 09/719,995

(22) PCT Filed: Mar. 2, 2000

(86) PCT No.: PCT/JP00/01229

§ 371 (c)(1),
(2), (4) Date: Dec. 19, 2000

(87) PCT Pub. No.: WO00/63467

PCT Pub. Date: Oct. 26, 2000

(30) Foreign Application Priority Data

Apr. 20, 1999 (JP) .............................. 11-112797

(51) Int. Cl.[7] .............................................. C30B 25/18
(52) U.S. Cl. ............................. 117/90; 117/94; 117/97; 117/106; 117/935; 143/33.1
(58) Field of Search ................. 117/94, 97, 935, 117/106, 90; 423/348; 148/33.1

(56) References Cited

U.S. PATENT DOCUMENTS 5,340,437 A * 8/1994 Erk et al. .................... 156/639
5,976,983 A * 11/1999 Miyazaki et al. ........... 438/692
6,294,469 B1 * 9/2001 Kulkarni et al. ............ 438/689

FOREIGN PATENT DOCUMENTS

JP 4-357106 * 12/1992

OTHER PUBLICATIONS

Japanese Patent Office, Japanese Patent Provisional Publication No.: 4–122023, Date of Publication: Apr. 22, 1992, Application No.: 2–243474, Filing Date: Sep. 13, 1990, pp. 147–155.

Japanese Patent Office, Japanese Patent Provisional Publication No.: 3–295235, Date of Publication: Dec. 26, 1991, Application No.: 2–97219, Filing Date: Apr. 12, 1990, pp. 211–215.

* cited by examiner

*Primary Examiner*—Robert Kunemund
(74) *Attorney, Agent, or Firm*—Snider & Associates; Ronald R. Snider (57) ABSTRACT

By forming a silicon single-crystal thin film direct on a chemically etched substrate, a time required for all the process can be effectively shortened, which largely contributes to reduction in production cost of a silicon epitaxial wafer and improvement on production efficiency thereof, with the result that a reduced wafer price at a user's end and a short delivery time are ensured. In a technical aspect, an etching removal in a chemical etching treatment is set to be 60 $\mu$m or more and thereby, a glossiness of a front main surface of a chemically etched substrate can be ensured to be 95% or higher. With such a glossiness of the front main surface of the substrate employed, a surface glossiness of a silicon single-crystal thin film formed on the front main surface of the chemically etched substrate can be increased to 95% or higher, thereby, enabling an auto-alignment treatment in a lithographic step coming later with no trouble.

28 Claims, 10 Drawing Sheets

| | etched-off thickness by TMAH (μm) | before epitaxial layer growth | after epitaxial layer growth |
|---|---|---|---|
| 1 | with no wet etching |  |  |
| 2 | 1.5 |  |  |
| 3 | 4 |  |  |
| 4 | 8 |  |  |

FIG. 16

| | etched-off thickness by TMAH (μm) | before epitaxial layer growth | after epitaxial layer growth |
|---|---|---|---|
| 1 | with no wet etching |  |  |
| 2 | 1.5 |  |  |
| 3 | 4 |  |  |
| 4 | 8 |  |  | wet etching with TMAH, followed by vapor phase etching with HCl

SILICON EPITAXIAL WAFER AND ITS MANUFACTURING METHOD

TECHNICAL FIELD

This invention relates to a silicon epitaxial wafer obtained by forming a silicon single-crystal thin film on a silicon single-crystal substrate and a production process therefor.

BACKGROUND ART

A silicon epitaxial wafer obtained by forming a silicon single-crystal thin film in vapor phase growth on a silicon single-crystal substrate, in general, has been produced according to a process as described next: First, a silicon single crystal ingot produced by means of a FZ (floating zone) method, a CZ (Czochralski) method or the like is sliced into wafers with a saw blade. A wafer obtained in slicing is chamfered along peripheral edges, followed by lapping on both sides thereof and furthermore, the wafer receives a chemical etching treatment on all the surfaces thereof. The wafer after the chemical etching receives is further mirror-polished by means of a chemical-mechanical polishing processing and thereafter, proceeds to a vapor phase growth step for forming a silicon single-crystal thin film thereon. Note that the chemical etching treatment is to remove a surface strained layer of a silicon single-crystal wafer caused by mechanical processings in preceding steps such as slicing, lapping and others. Generally speaking, the chemical etching treatment is performed by immersing the silicon single-crystal wafer in an acid etching liquid such as a nitric acid/hydrofluoric acid aqueous solution, wherein a etching removal (which is defined as the sum of decreases in thickness at both sides of a wafer) thereof amounts to the order of from 20 $\mu$m to 40 $\mu$m.

In the mean time, a processing technique for a silicon single-crystal wafer has achieved a tremendous progress in aspects of improvement on qualities such as crystallinity, accuracy in shape and dimensions, keeping pace with development of a semiconductor fabrication technique including an integrated circuit related technique for LSI as a primary part. On the other hand, however, insofar as fabrication of discrete semiconductor devices represented by a transistor and a diode is concerned, a strong demand for cost reduction and a short delivery time of the wafer from the view point of a processing technique thereof has been built up rather than improvement on qualities, though being attached with great importance in the field of integrated circuit devices.

It is accordingly an object of the invention is to provide a silicon single epitaxial wafer that can be produced with smaller mandays at low cost and a production process therefor.

DISCLOSURE OF INVENTION

A silicon epitaxial wafer of the invention provided for achieving the above described object is characterized by that a silicon single-crystal thin film is formed on a chemically etched silicon single-crystal substrate with a surface glossiness of 95% or higher. Furthermore, a production process for a silicon epitaxial wafer of the invention has a characteristic procedure in which a silicon single-crystal thin film with a surface glossiness of 95% or higher is formed in vapor phase on a chemically etched substrate obtained by chemically etching a to-be-treated silicon single-crystal substrate. Herein, the term "glossiness" means a specular glossiness defined in paragraph 3.1 of JIS Z8741 (1962). A surface glossiness of a silicon single-crystal substrate whose surface has been mirror-polished by a chemical-mechanical polishing processing, which is described above, is almost 100%.

In a conventional production process for a silicon epitaxial wafer, a silicon single-crystal thin film was formed on a substrate having received steps of chemical etching and mirror-polishing in this order, while in the invention, a silicon single-crystal thin film is formed direct on a chemically etched substrate. That is, in the invention, by deleting a mirror-polishing step, a time required for all the process can be effectively shortened, which largely contributes to reduction in production cost of a silicon epitaxial wafer and improvement on production efficiency thereof, with the result that a reduced wafer price at a user's end and a short delivery time are ensured.

Furthermore, a production process for a silicon epitaxial wafer of the invention has a major feature that a surface glossiness of a silicon epitaxial wafer obtained by forming a silicon single-crystal thin film on a chemically etched substrate is 95% or higher. This is because of the following reasons: That is, when a chemical etching treatment of an etching removal of from 20 $\mu$m to 40 $\mu$m that has been generally performed with an acid etching liquid such as a nitric acid/hydrofluoric acid aqueous solution is applied to a wafer to produce a chemically etched substrate, a silicon single-crystal thin film formed on a front main surface of such a chemically etched substrate has a poor surface glossiness, resulting in a problem in an exposure processing of a photolithographic step performed after formation of the silicon single-crystal thin film, since in the exposure processing, an auto-alignment operation of a transfer pattern thereon is poorly performed. The problem is considered to be caused by inability of correct reading of a pattern on the substrate in auto-alignment (the pattern is formed in a lithographic step and a diffusion step in advance) due to reduction in glossiness.

The inventors of the invention have, however, attained through serious research conducted by them findings that a surface glossiness of a chemically etched substrate can be dramatically improved by increasing a etching removal compared with a normal practice; To be concrete, for example, in a case of an n-type chemically etched substrate, a surface glossiness of the chemically etched substrate can be increased to 95% or higher with an etching removal of 60 $\mu$m or more. Moreover, when a silicon single-crystal thin film is formed on a chemically etched substrate having such a dramatically increased surface glossiness, a glossiness of a front main surface of a silicon epitaxial wafer obtained can be ensured to be 95% or higher and the above described auto-alignment processing on the silicon epitaxial wafer in a photolithographic step can be performed with no trouble.

In the mean time, a technical concept, itself, of simply forming a silicon single-crystal thin film direct on a chemically etched substrate is of a known technique, as disclosed in, for example, FIG. 2 of JP-A-91-295235 and FIG. 5 of JP-A-92-122023. In the published documents, however, neither disclosure is found on values of glossiness of a main surface of a wafer before and after formation of a silicon single-crystal film thereon, nor is description or suggestion is available about influence of a surface glossiness exerted on a lithographic step as described above. In addition, both of the techniques adopt mirror-polishing after formation of a silicon single-crystal thin film as a last resort for achieving improved flatness of a front main surface of the as-grown silicon single-crystal thin film, which suggests that no sufficient flatness is achieved without the mirror-polishing. If mirror-polishing is added in any way as a process step after formation of a silicon single-crystal thin film, it is apparent that no effect of reduction in mandays, which is an object of the invention, can be attained at all. In contrast to the conventional practices, according to the invention, an etching removal of a chemically etched substrate is controlled so as to sufficiently increase a glossiness on a front main surface thereof and thereby, a surface glossiness of an as-grown silicon single-crystal thin film thereon can be 95% or higher; therefore, an additional mirror-polishing, which has been adopted in a conventional practice, is not required in any way.

BEST MODE FOR CARRYING OUT THE INVENTION

Description will be given of embodiments below with reference to examples showing in the accompanying drawings.

FIRST EXAMPLE

Figure 1A:
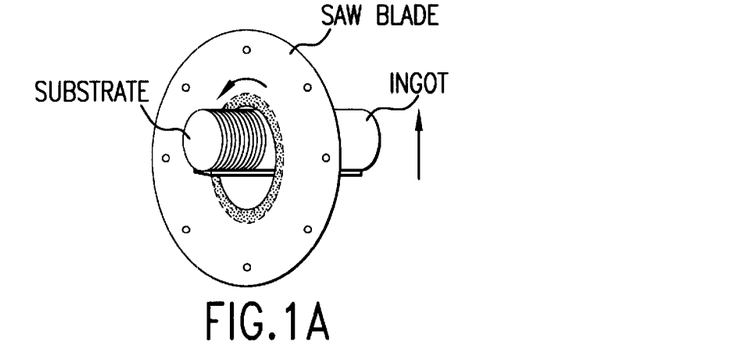
FIGS. 1A to 1D are schematic illustrations of steps describing an example of a production process for a silicon epitaxial wafer of the invention.
Figure 1B:
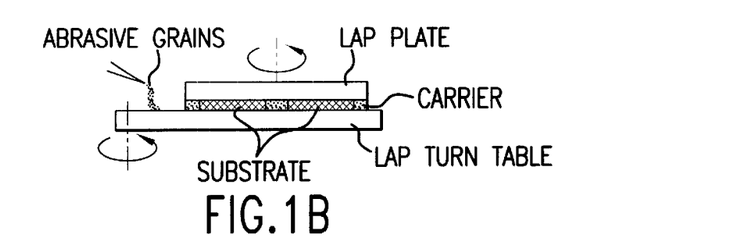

FIGS. 1A to 1D are illustrations of steps describing an example of a production process for a silicon epitaxial wafer relating to the invention. First of all, unnecessary portions of a silicon single-crystal ingot produced by means of a FZ method or a CZ method are cut off and furthermore, peripheral grinding is applied to the ingot to shape after the cutting off of the unnecessary portions. The shaped ingot is machined to form an orientation flat surface along a side thereof and then, sliced using a inner diameter saw blade or the like into silicon single-crystal substrates (hereinafter simply referred to as a substrate, too) as shown in FIG. 1A. Thereafter, the substrates are subjected to double-side lapping using loose abrasive grains to lap both surfaces thereof as shown in FIG. 1B. Peripheral edges of both surfaces of each substrate are chamfered by bevel processing before going into the lapping, though the chamfering is not shown in the figures. Part of the process up to the lapping is the same as a corresponding part of a conventional production process for a silicon epitaxial wafer.

Figure 1C:
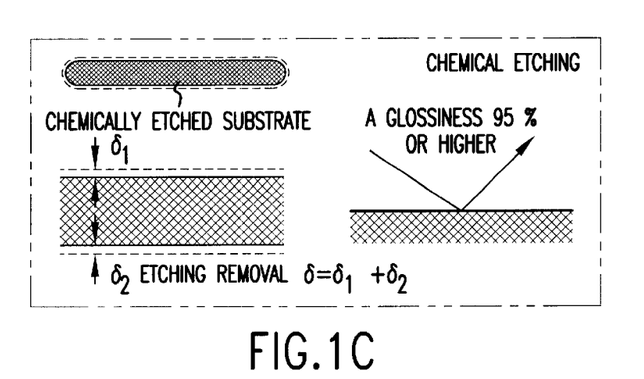

Next, as shown in FIG. 1C, each of the as-lapped substrates as a to-be-treated silicon single-crystal substrate is immersed in an acid etching liquid to receive a chemical etching treatment on both surfaces thereof and obtain a chemically etched substrate. As an acid etching liquid, for example, a nitric acid/hydrofluoric acid/acetic acid aqueous solution can be employed. Note that a known acid etching liquid can be employed and compositions of the acid etching liquid is shown in, for example, the following reference "precision machining technique for an electronics-use crystalline material," (K.K) Science Forum 1985, p. 438, Table 1.

In the invention, it is desirable in order to attain a high surface glossiness that an acid etching liquid having a composition at which a chemical reaction is of a diffusion-controlled process is employed. With an etching liquid having a composition at which a chemical reaction is reaction rate-controlled employed, there is a case that a substrate surface is roughened to the contrary. Whether a reaction in an acid etching liquid is of a reaction rate-controlled type or a diffusion-controlled type can be judged according to whether or not a reaction rate is increased, for example, when the etching liquid is stirred. When an etching solution is stirred, a case where a conspicuous increase in reaction rate is observed is of a diffusion-controlled reaction, while a case where a reaction rate does not change so much is of a reaction rate-controlled type. In the above described reference, shown is the following empirical fact that in a case where nitric acid/hydrofluoric acid/acetic acid aqueous solution is employed, if, in the etching liquid, a weight of nitric acid is $[HNO_3]$, a total weight of water is $[H_2O]$ and a concentration of nitric acid is $\beta=\{[H_2O]/([H_2O]+[HNO_3])\}\times100$ (%) by definition, when $\beta<50\%$, a reaction is diffusion-controlled. Accordingly, it is desirable that when a nitric acid/hydrofluoric acid/acetic acid aqueous solution is employed, a concentration of nitric acid is adjusted so that $\beta<50\%$.

Figure 9:
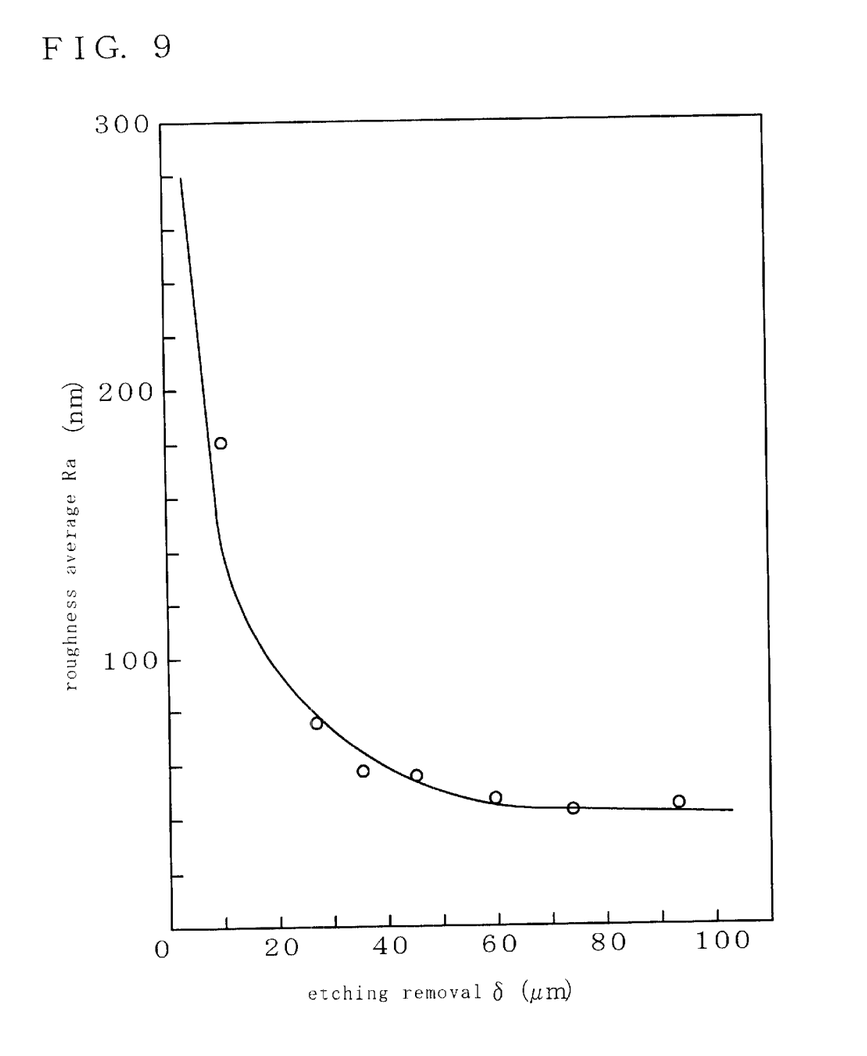
FIG. 9 is a graph showing an example relationship of an etching removal $\delta$ and a center line surface roughness of a front main surface on an n+ substrate obtained by plotting measured values.

A chemical etching treatment of the invention mainly has two purposes. One is to remove of a work damage layer caused by slicing or lapping similar to a prior art technique, while the other is specific to the invention, and to sufficiently increase surface glossiness of a chemically etched substrate and increase a glossiness of a surface of a silicon single-crystal thin film formed on the substrate to 95% or higher. In order to attain such a glossiness, it is effective to set an etching time for the substrate in the following way:

FIG. 9 is a graph showing an example of results as measured on a surface roughness of a substrate after a chemical etching treatment while setting a etching removal by the chemical etching treatment in various ways. As a to-be-treated silicon single-crystal substrate, a <111> oriented substrate heavily doped with antimony Sb, and of 125 mm in outer diameter is employed and the substrate is chemically etched using a nitric acid/hydrofluoric acid/acetic acid aqueous solution of a composition at which a reaction is diffusion-controlled. Note that a surface roughness means an arithmetic average deviation from the center line (roughness average) Ra defined in JIS B0601 (1994). Note again that an etching removal δ is herein defined such that when decreases in thickness on both sides at the center points of the surfaces thereof of a substrate caused by etching are δ1 and δ2, respectively, by definition, δ=δ1+δ2. Such an etching removal δ can be easily measured from a change in thickness before and after the etching treatment.

Herein, the etching removal δ increases with increase in the etching time; therefore, the graph of FIG. 9 can be said to be one to show a dependency of a surface roughness of a substrate on an etching time. As can be seen from the graph, while a substrate surface roughness rapidly decreases with increase in etching time in a region where an etching time is comparatively short; then a rate of decrease in roughness is gradually smaller; and with further increase in etching time, the substrate surface roughness becomes settled at almost a constant value regardless of an etching time length in a region where the etching time is comparatively long. That is, when an etching time is longer than a value, a substrate surface roughness remains unchanged but comes to show almost a constant value, regardless of elapse of an etching time (hereinafter referred to as a saturated roughness). Then, if an etching time is adopted in which a substrate surface roughness reaches to the saturated roughness, a surface glossiness of 95% or higher of a chemically etched substrate can be easily ensured. According to FIG. 9, an etching removal δ at which a substrate surface roughness reaches the saturated roughness is about 60 μm, and when an etching time is adjusted such that δ≧60 μm, a glossiness of a main surface of a silicon epitaxial wafer obtained by forming a single-crystal thin film on a chemically etched substrate can be 95% or higher. It is more desirable that δ≧70 μm in order to ensure a glossiness of 95% or higher of a chemically etched substrate. However, even if a etching removal is larger than 150 μm, no improvement on glossiness is available; therefore, it is preferable that δ≦150 μm.

Figure 1D:
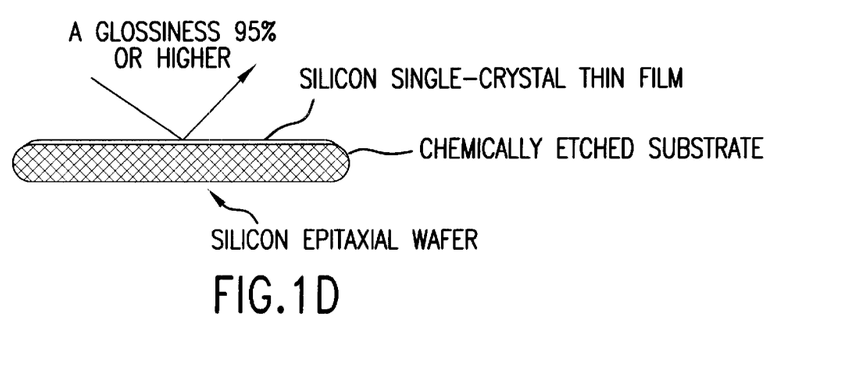

Returning to FIG. 1, as described above, both main surfaces of a chemically etched substrate is prepared to be a glossiness of 95% or higher and a silicon single-crystal thin film is formed on one main surface of the substrate in a known vapor phase growth step as shown in FIG. 1D and thereby, a silicon epitaxial wafer is obtained. By use of a chemically etched substrate having a surface glossiness of 95% or higher in production of a silicon epitaxial wafer, a glossiness of a front main surface of the silicon epitaxial wafer can be ensured to be 95% or higher. When such a silicon epitaxial wafer is adopted, auto-alignment in a lithographic step in which patterns such as of circuits and others are formed on a front main surface of a silicon epitaxial wafer can be performed with certainty. The following description is results of experiments to provide a ground for the above described effect.

Figure 7:
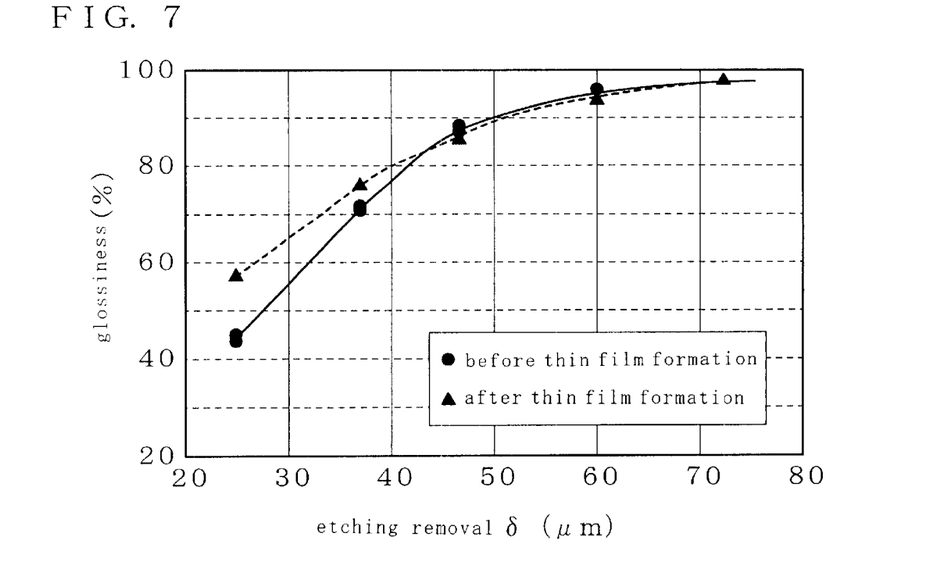
FIG. 7 is a graph showing an example relationship of an etching removal $\delta$ and a main surface glossiness on an $n^+$ substrate obtained by plotting measured values.
Figure 8:
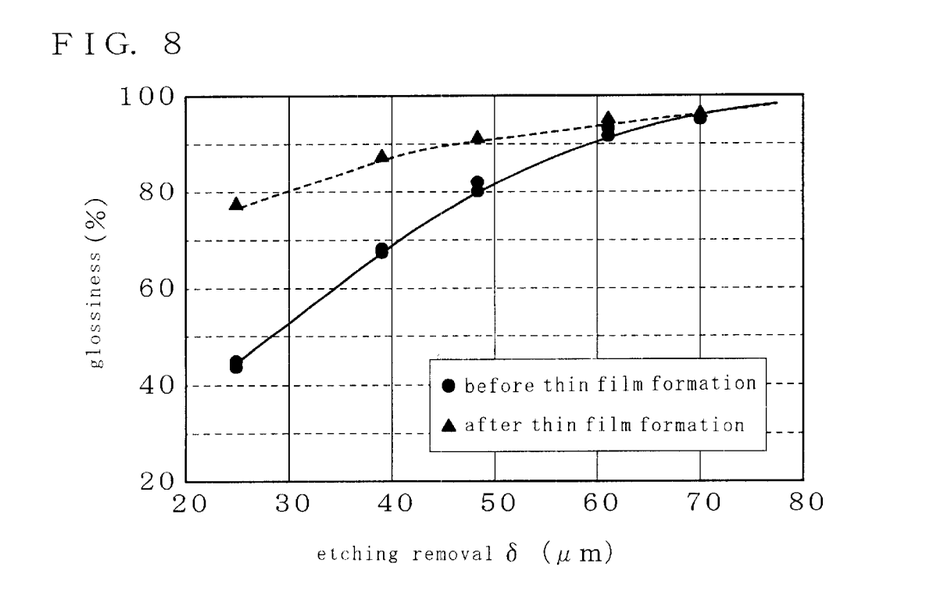
FIG. 8 is a graph showing an example relationship of an etching removal $\delta$ and a main surface glossiness on a $p^+$ substrate obtained by plotting measured values.

First of all, a plurality of n-type, <111> oriented substrates heavily doped with antimony Sb (hereinafter referred to as n$^+$ substrate) of 125 mm in outer diameter and a plurality of p-type, <111> oriented substrates heavily doped with boron B (hereinafter referred to as p$^+$ substrate) of 125 mm in outer diameter were prepared as to-be-processed silicon single-crystal substrates. The substrates of both kinds were chemically etched using a nitric acid/hydrofluoric acid/acetic acid aqueous solution having a composition at which an etching chemical reaction is of a diffusion-controlled type such that etching removals δ of the as-treated substrates were obtained as various values in the range of from 20 μm to 80 μm. The as-treated substrates were measured on a surface glossiness according to a method defined in JIS, which is described above. In FIG. 7, shown is the measurement results on the n$^+$ substrates and in FIG. 8, shown is the measurement results on the p$^+$ substrates, wherein black solid circles are plotted data from the experiments. In the case of the n$^+$ substrates, a surface glossiness is ensured to be 95% or higher when δ≧60 μm. As another facts, it is found that in any of the cases of the substrates of both types, a surface glossiness of a substrate is ensured to be 95% or higher when δ≧70 μm. It is further found that a glossiness of any of the substrates of both types is completely saturated in a region where δ>150 μm.

Note that as other kinds of to-be-processed silicon single-crystal substrates, there can be named: a substrate doped with arsenic As or phosphorus P, a substrate lightly doped with a dopant, or a substrate with a crystallographic orientation of <100>, wherein in a case of any kind of substrate, an acid etching liquid in use has to be of a composition adjusted so that a chemical reaction at the composition is diffusion-controlled.

Next, a silicon single-crystal thin film with about 14 μm in thickness was formed on a front main surface of each chemically etched substrate by means of a vapor phase growth method to obtain a silicon epitaxial wafer (hereinafter simply referred to as epitaxial wafer) and a glossiness of a front main surface of the as-grown thin film was measured. The measurement results are shown in FIGS. 7 and 8, wherein black triangle marks show plotted data. It is found that in almost cases of substrates of both types, a surface glossiness of an as-grown thin film on each substrate in most cases increases after formation of a thin film compared with that of the substrate and in limited cases of substrates of an etching removal δ of 60 μm or more, a surface glossiness of an as-grown thin film is obtained to be 95% or higher.

Figure 10A:
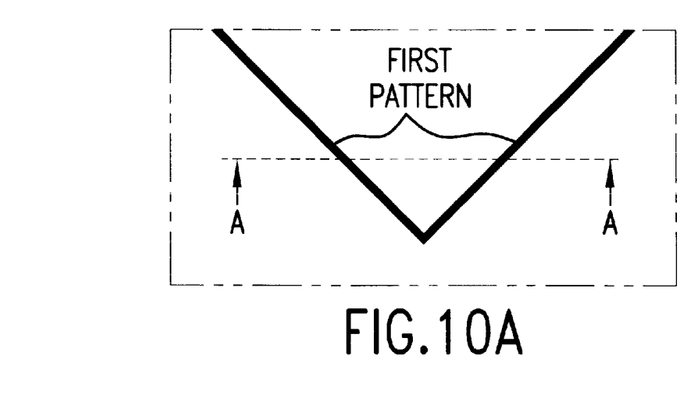
FIGS. 10A to 10D are views in plan or section describing a way of formation of photolithographic patterns used in experiments for confirming the effect of the invention.
Figure 10B:
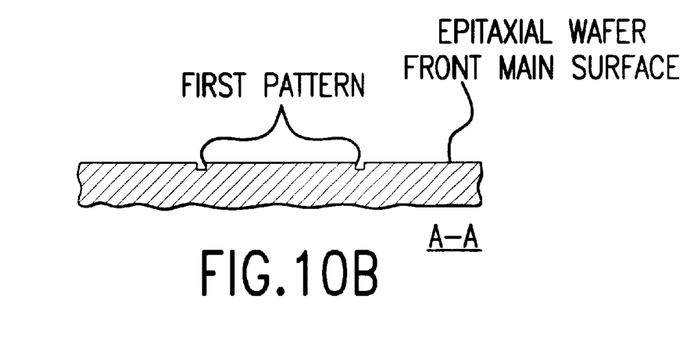

After the vapor phase growth, a front main surface of each of the epitaxial wafers thus obtained is subjected to processings in a first lithographic step and a diffusion step to produce a first pattern as shown in FIGS. 10A and 10B, wherein the first pattern is formed in a plan shape in which two line figures intersect with each other approximately at a right angle, each line having a groove section of about 4 μm in width and about 0.5 μm in depth. Following formation of the first pattern, a patterned mask is used in an operation of an automatic positioning (which is auto-alignment) on an epitaxial wafer as described above in a known aligner with the first pattern as an alignment marker pattern. The auto-alignment operation is performed in a series of sub-operations in which reflecting light beams from pattern edges on the mask and the epitaxial wafer, respectively, are detected with a photoeletric effect, and the epitaxial wafer and the mask are moved relatively to each other such that misalignment of the pattern edges with each other is canceled. In Tables 1 and 2, shown are success or failure in auto-alignment operation for the respective cases of n$^{30}$ and p$^+$ substrates, wherein a white circle mark indicates a success of auto-alignment and a cross mark indicates a failure of auto-alignment. That is, it is found that auto-alignment can be successful on a front main surface of an as-grown thin film having a glossiness of 95% or higher.

TABLE 1

| No. | etching removal δ (μm) | glossiness before thin film formation (%) | glossiness after thin film formation (%) | auto-alignment success or failure |
|---|---|---|---|---|
| 1 | 25 | 44.7 | 57.9 | X |
| 2 | 37 | 71.7 | 76.5 | X |
| 3 | 46 | 87.3 | 85.7 | X |
| 4 | 60 | 96.0 | 95.0 | ◯ |
| 5 | 73 | 99.0 | 97.7 | ◯ |

TABLE 2

| No. | etching removal δ (μm) | glossiness before thin film formation (%) | glossiness after thin film formation (%) | auto-alignment success or failure |
|---|---|---|---|---|
| 11 | 25 | 40.0 | 77.0 | X |
| 12 | 39 | 67.0 | 87.5 | X |
| 13 | 48 | 81.3 | 91.8 | X |
| 14 | 61 | 92.7 | 95.2 | ◯ |
| 15 | 70 | 95.0 | 96.2 | ◯ |

Figure 10C:
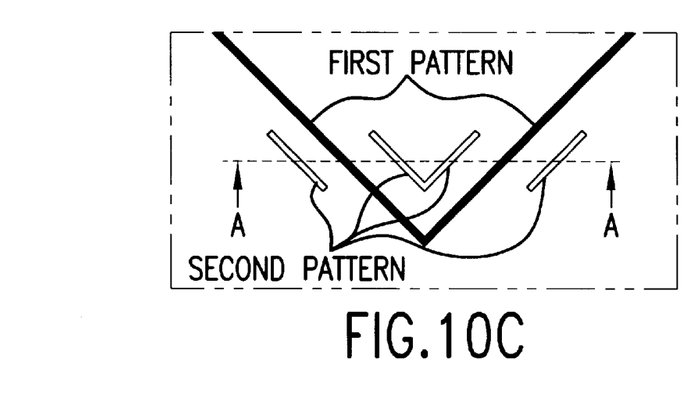
Figure 10D:
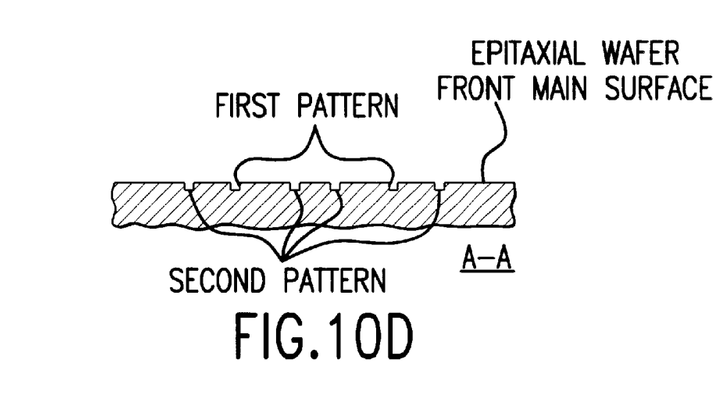

Next, a patterned mask was placed on each epitaxial wafer and thereafter, a lithographic step and a diffusion step for the second time were performed with the patterned mask placed to form a second pattern, shown in FIGS. 10C and 10D. The second pattern is constituted of two line figures placed in parallel to and near respective both sides, upper and lower, of each of the two arms, left and right, of the first pattern, the second pattern totally including four line figures, wherein a section of each line figure of the second pattern is a groove of about 4 μm in width and about 0.2 μm in depth. Pattern position signals were measured along a measurement line of A—A of FIG. 10C by an optical detector equipped in an aligner on a front main surface of each epitaxial wafer on which the second pattern was formed.

Figure 11:
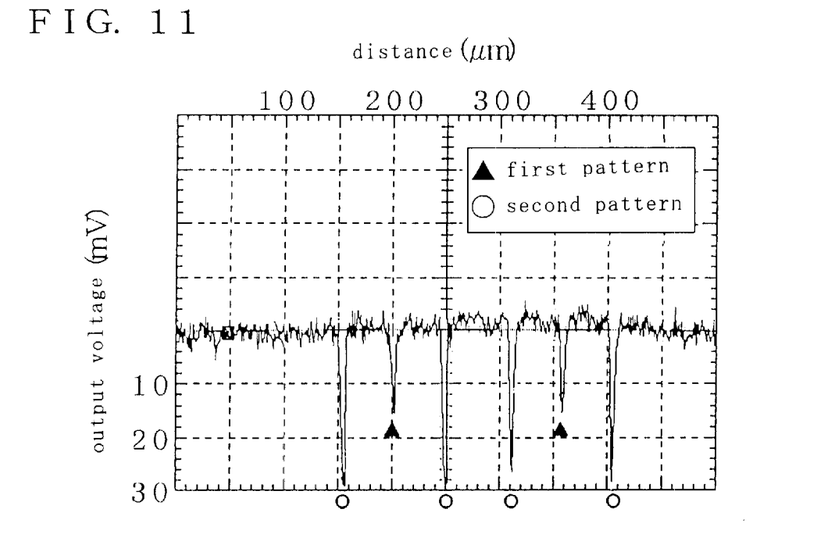
FIG. 11 is a graph showing a chart of an output voltage as a pattern position signal with a distance as an abscissa thereof after formation of a photolithographic pattern in a case of a etching removal $\delta=70$ $\mu$m.
Figure 12:
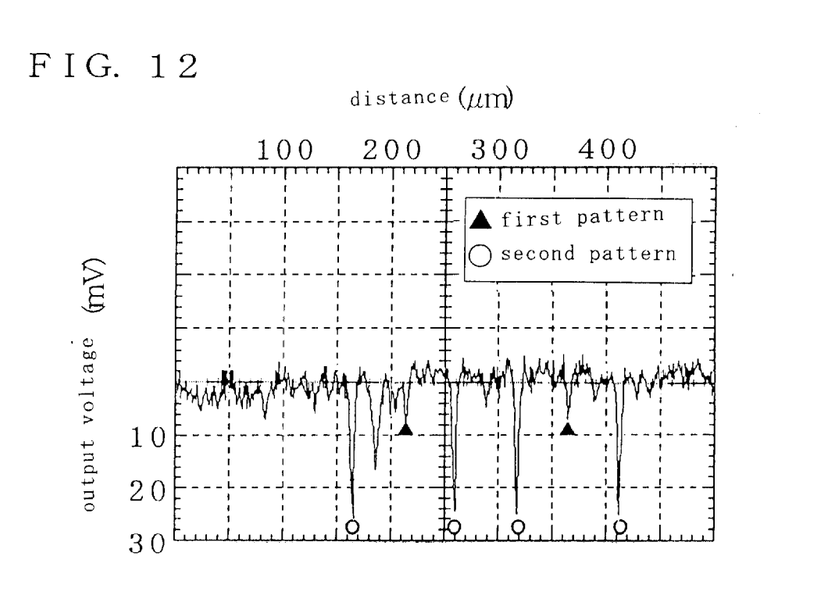
FIG. 12 is a graph showing a chart of an output voltage as a pattern position signal with a distance as an abscissa thereof after formation of a photolithographic pattern in a case of a etching removal $\delta=25$ $\mu$m.

FIG. 11 is results of measurement of the patterns on the epitaxial layer surface of an epitaxial wafer obtained by forming an epitaxial layer of 14 μm in thickness on an n$^+$ substrate of 73 μm in etching removal, wherein a black triangle mark in the graph and a white circle mark show output voltage values of pattern position signals correspond to the first pattern and the second pattern, respectively. A glossiness of the front main surface of an epitaxial wafer is very high to be 97.7% as shown in Table 1 and amplitudes of background wave of a pattern position signal in output voltage are small; a peak of the first pattern employed in auto-alignment can be clearly discriminated. On the other hand, FIG. 12 is results of measurement of the patterns on epitaxial layer surface in the case of an etching removal δ of 25 μm. A glossiness of the front main surface of an epitaxial wafer is as low as 57.9% and amplitudes of background wave of a pattern position signal in output voltage are generated large and in addition, peaks bearing no relation with any of the patterns are observed as well. It is estimated that the background wave and the irrelevant peaks combined function as noise, which leads to failure to detect edges of the first pattern for alignment markers and as a result, auto-alignment became impossible to be performed.

SECOND EXAMPLE

Figure 2:
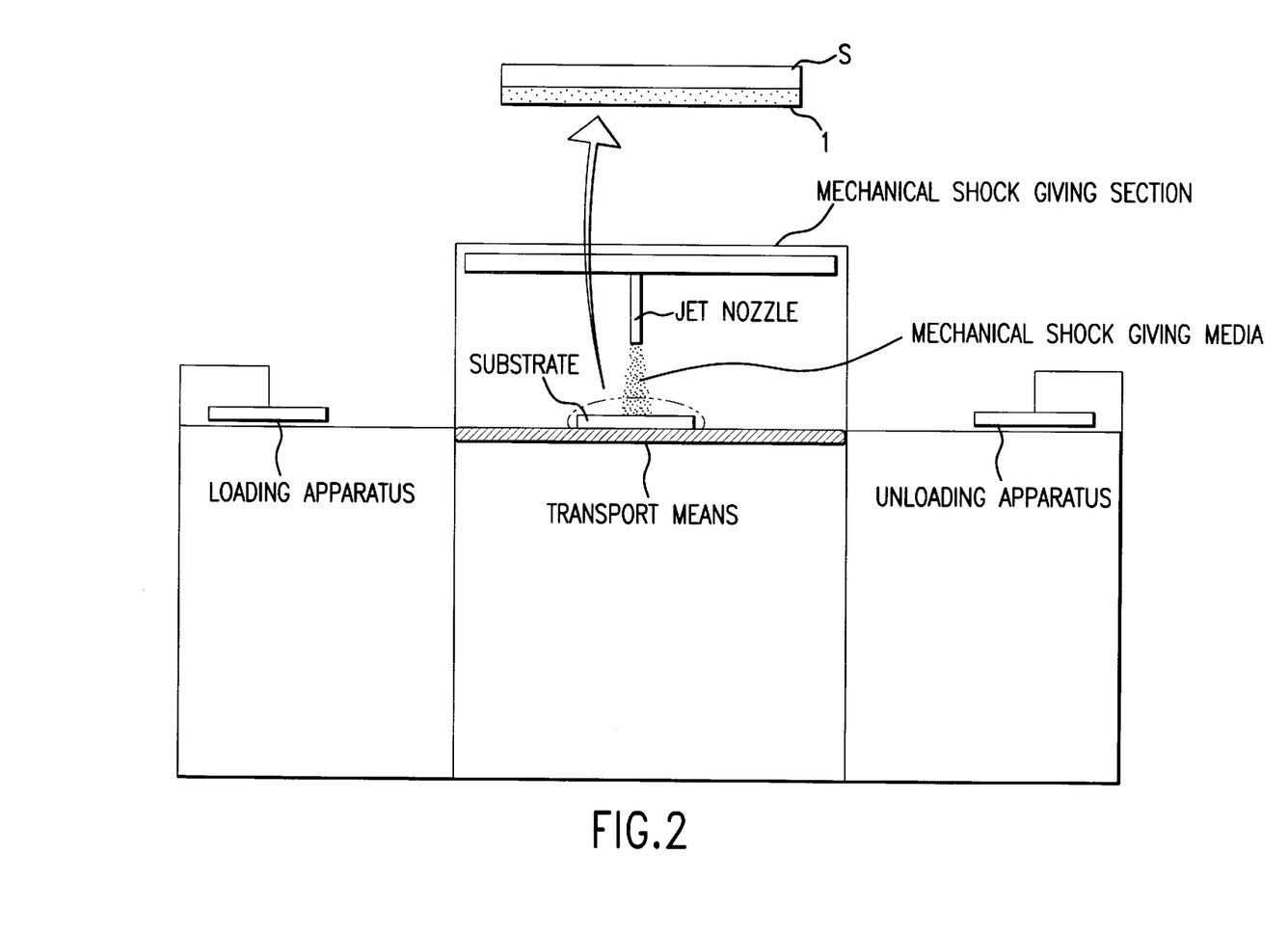
FIG. 2 is a schematic side view exemplarily showing an operation in a backside damage step and a way of use of a coat layer as a contact blocking member.

There is a case where in the production process for an silicon epitaxial wafer of the invention, a rear surface side of a chemically etched substrate receives a processing specific to a rear surface side of the epitaxial wafer after the chemical etching treatment before vapor phase growth of a silicon single-crystal thin film while supporting the chemically etched substrate with a support by a front main surface which is the other surface thereof serving as a prospective front main surface of the silicon epitaxial wafer. As the rear surface processing step, included are a step in which a rear surface work damage-strained layer is formed (a so-called backside damage step) for achieving a capability of extrinsic gettering or the like, and a step in which a rear surface coat film for purposes to prevent auto-doping and others is formed by means of a CVD method or the like. As the support, used are a transport means of a transport mechanism for use in transportation of a substrate in order to transfer the substrate to a next step: for example, as shown in FIG. 2, a belt conveyor arranged along a substrate transport course, or the like. FIG. 2 is to show an example of the back side damage step, wherein a substrate transported by a loading apparatus is transferred into a mechanical shock giving section on the belt conveyor, and mechanical shock giving media (for example, constituted of silicon particles or silica particles) are forced to impinge on the substrate rear surface to form a rear surface work damage-strained layer.

As is apparent from an example of FIG. 2, when a substrate receives a processing on the rear surface thereof, a front main surface side thereof on which a silicon single-crystal thin film is formed in a later step has to be held by a support such as a belt conveyor or the like. At this time, if a front main surface of the substrate is put into direct contact with the support, damages such as surface flaws are produced, and thereby, a risk arises to cause a defect in a silicon single-crystal thin film during its formation. Therefore, a contact blocking member for preventing direct contact between the front main surface and the support is employed being interposed therebetween and thereby, the front main surface of the substrate on which a silicon single-crystal thin film is to be formed can be protected and in turn, generation of a contact-causing crystal defect in the silicon single-crystal thin film can be prevented from occurring.

As a contact blocking member, at least a contact portion of the member with a front main surface of the substrate can be made from a material softer than a silicon single-crystal. When a contact portion with the front main surface is made from a material softer than silicon single-crystal, an impact force to be transmitted along the front main surface can be effectively absorbed, thereby enabling exercise of a conspicuous protective effect.

Figure 3:
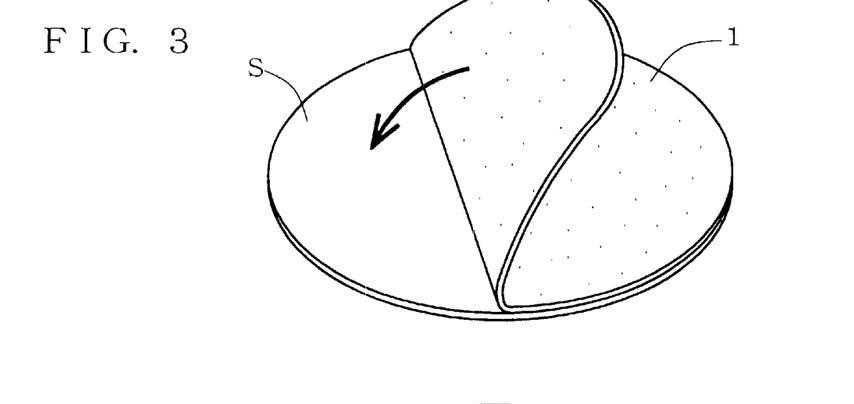
FIG. 3 is a perspective view showing an example coat layer as a contact blocking member.

FIG. 3 shows an example thereof and a coat layer 1 formed in a sheet-like shape from a soft polymer material, for instance, foamed polyurethane resin in this example, is stacked so as to cover all the front main surface in close contact with the front main surface of a chemically etched substrate S, but in a detachable manner. The coat layer 1 is, as shown in FIG. 2, interposed between the substrate S and the belt conveyor (the support) to protect the front main surface of the substrate S. Note that as methods for attaching a coat layer 1 fixedly on a front main surface of a substrate S in a detachable manner, there are available: a method in which a trace of water (or a liquid of another kind) is applied on a front main surface of a substrate S and a coat layer 1 is superimposed on the front main surface to fasten the coat layer 1 (a so-called water paste method, and in addition to this, when a coat layer 1 is made from a material having proper tackiness such as many kinds of soft rubbers, a method can also be considered in which a tacking effect thereof is utilized to fasten the coat layer on a front main surface of a substrate S.

Figure 4A:
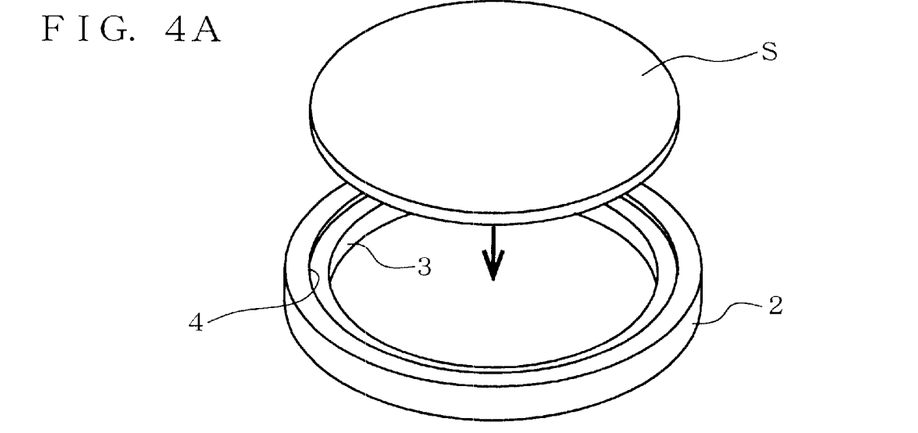
FIGS. 4A and 4B are a perspective view and a sectional view of another example of the contact blocking member.
Figure 4B:
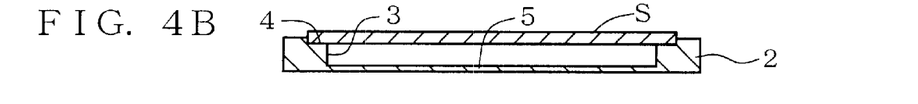

On the other hand, as a contact blocking member, a member can be employed that is placed on a support and used in such a manner that the member supports a chemically etched substrate S in contact with an outer peripheral surface of the substrate S and/or an outer peripheral edge of the front main surface thereof while preventing direct contact between the front main surface and the support. FIG. 4 shows an example thereof. For instance, a contact blocking member 2 shown in the figure is made from a soft polymer material such as rubber in the entirety thereof (or limitedly in a contact portion with the substrate S); and not only is a recess 3 with a bottom smaller in diameter than the substrate S formed in the upper side of the member 2 with an opening upward, but an annular step portion 4 for resting the substrate is also provided, the annular step portion 4 sinking from the top in the opening and being formed along the inner periphery of the opening. The substrate S is fittingly inserted inside the annular step portion 4 with the front main surface down. As a result, the substrate S is supported at the outer peripheral portion of the front main surface thereof by the bottom surface of the annular step portion 4 with the action of a reactive upward force from under. In this state, the contact blocking member 2 is further supported at the lower surface side thereof by the support. In this case, the support may be conveyor rollers or the like in addition to the belt conveyor as described above.

Figure 5:
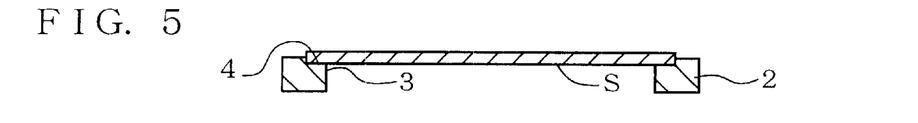
FIG. 5 is a sectional view showing an example modification of the contact blocking member of FIGS. 4A and 4B.

While the bottom 5 closing the lower side of the recess 3 can be deleted as shown in FIG. 5, for example, a structure can be said to be advantageous in which the contact blocking member 2 has the bottom 4 as shown in FIG. 4 when the substrate S is transported by, for example, a belt conveyor or the like since the substrate is difficult to be contaminated with metals originating from or to be adversely affected by the transport means. On the other hand, another structure of the contact blocking member 2 can be adopted in which the recess 3 is deleted, the bottom of the annular step portion 4 is extended radially toward inside to form a shallow accommodation recess and the substrate S may be accommodated in the accommodation recess.

Figure 6:
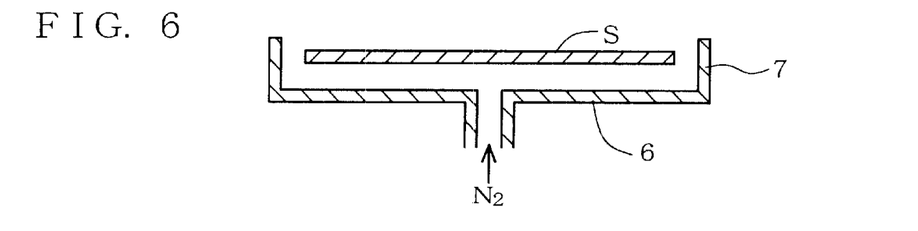
FIG. 6 is a sectional view showing still another example of the contact blocking member.

A further alternative, a contact blocking member of the invention may be a compressed gas such as compressed nitrogen. That is, as shown in FIG. 6, a compressed gas is made to blow to the center portion of a front main surface of a chemically etched substrate S and thereafter change a blowing direction thereof radially toward the periphery along the surface, which causes to float the chemically etched substrate S from a disc 6 according to Bernoulli's theory. In this case, it is recommended that movement of the substrate S in a horizontal plane is restricted by nail members or a peripheral wall 7.

While, in the invention, a contact blocking member is interposed between a substrate and a support, the term "interposition" is herein defined in a broad sense such that the term means all conditions or states including a situation in which an indirect contact is provided between a substrate and a support. Hence, the concept of "interposition" includes a case where a substrate is physically supported only at and along the outer peripheral portion of a front main surface thereof as shown in FIG. 4 or 5 and in another case where a substrate is supported in a floating state from a support as shown in FIG. 6 in addition to the case in a narrow sense where a contact blocking member is placed between a substrate and a support as shown in FIG. 2.

THIRD EXAMPLE

In the production process for a silicon epitaxial wafer shown in the second example, a contact blocking member for preventing direct contact between a front main surface of a substrate and a support from occurring was used when the substrate receives a processing on a rear surface side thereof corresponding to a rear surface of the silicon single-crystal wafer to be produced using the substrate. In this example, however, the process includes: a processing performed on a rear surface side of a chemically etched substrate while supporting the chemically etched substrate on which a silicon single-crystal thin film is formed by a front main surface thereof with a support in contact with the front main surface thereof (a rear surface side processing step); then, elimination of damage produced on the front main surface of the chemically etched substrate by contact of the support therewith (a damage eliminating step); and thereafter, a silicon single-crystal thin film being formed on the front main surface of the chemically etched substrate (a vapor phase growth step). That is, while in the second example, the process is performed based on the viewpoint of suppressing damage generation accompanying contact with the support to the lowest level possible; the basic idea leading this example is different from the second example in that the damage eliminating step is performed separately from the other steps in order not to suffer any trouble in growth of a silicon single-crystal thin film while allowing damage or the like inconvenience to be generated accompanying contact with the support to some extent. For example, damage or the like by an unexpected cause other than that occurring during transportation can be produced on the substrate, since a possibility of occurrence of impact or the like imposed on a front main surface side of a wafer is not necessarily limited during transportation of the substrate in which contact with the support arises. In the above described second example, there is a technical aspect that unfortunately, no damage as far as to be generated by such a different cause can be prevented. According to this example, however, any of damage produced before the damage eliminating step can be eliminated, even if the damage is produced by a cause other than contact with the support; therefore, a defect originating from such an external damage (for example, stacking faults and others) can be effectively prevented from generating in a silicon single-crystal thin film formed after vapor phase growth. Detailed description will be given of a concrete example below.

First of all, a plurality of vicinal <111> n$^+$ substrates misoriented by 3° from <111>, heavily doped with antimony Sb, and of 100 mm in outer diameter were prepared as to-be-processed silicon single-crystal substrates. The substrates were chemically etched using a nitric acid/hydrofluoric acid/acetic acid aqueous solution having a composition at which an etching chemical reaction is of a diffusion controlled type by 70 μm in thickness to obtain chemically etched substrates. The production process adopted is substantially the same as that shown in FIGS. 1A to 1D and a glossiness of main surface of each of the chemically etched substrates was ensured to be 95% or higher.

Figure 13:
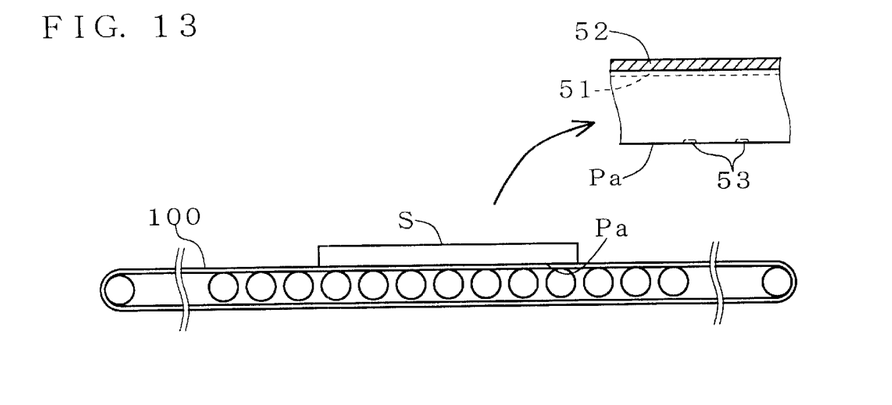
FIG. 13 is an illustration describing a way of transportation of a chemically etched substrate on a belt conveyor with a front main surface of the chemically etched substrate in direct contact with the belt conveyor.

Following the etching, as shown in FIG. 13, a rear surface work damage-strained layer 51 and an oxide film 52 for prevention of auto-doping (which, in this example, is produced by means of CVD and which is hereinafter referred to as CVD oxide film 52) were sequentially formed in this order on a rear surface side of the chemically etched substrate S. In these steps, processings were performed on the rear surface side of each of the chemically etched substrates S, while the front main surface Pa of each was in direct contact with a belt conveyor 100 which the substrate S is supported on and transported by. As a result, after the steps, damages of 50 nm to 70 nm in depth were produced on the front main surface of each of the chemically etched substrate S.

Figure 14A:
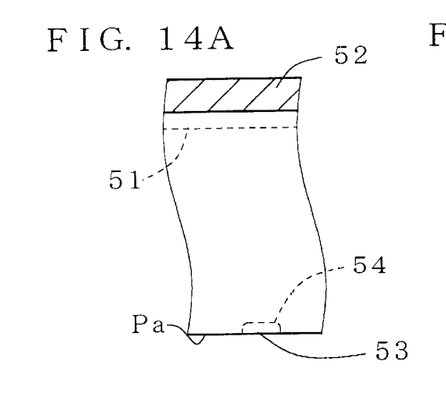
FIGS. 14A to 14D are illustrations showing a way of generating stacking faults in an epitaxial layer by damages formed on a front main surface of a chemically etched substrate and preventing generation of the stacking faults by eliminating the damages.
Figure 14B:
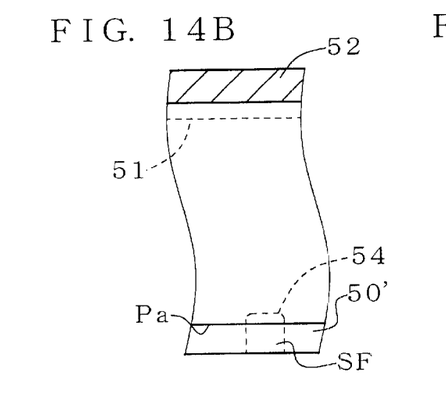

When as schematically shown in FIG. 14A, a damage 53 on the front main surface Pa of the substrate S accompanies a strained layer 54 in the vicinity of the surface Pa thereof, and as shown in FIG. 14B, an epitaxial layer 50' is grown in vapor phase on the front main surface Pa with the strained layer 54 not eliminated, then stacking faults SF are formed in a region corresponding to the strained layer 54 in the epitaxial layer 50'. The stacking faults SF are not preferable since the presence has a chance to cause a p-n junction leakage in a device fabricated on such a wafer.

Figure 14C:
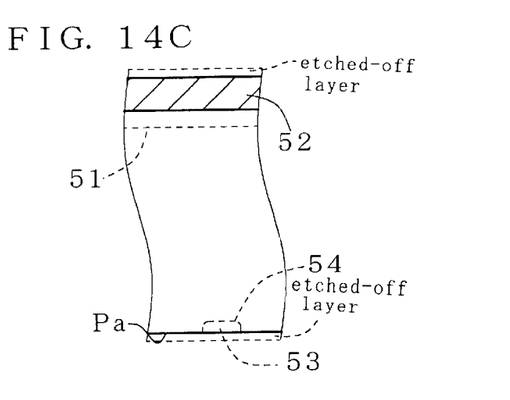

Hence, it is important that, as shown in FIG. 14C, the damage eliminating step is performed before formation of the epitaxial layer 50 to eliminate the damage 53 by etching. While, in general, an acid liquid or an alkaline liquid is employed in etching a single crystal, the acid liquid can etch not only silicon single crystal but also an oxide film with ease; therefore, the use of an alkaline etching liquid is desirable in wet etching for a chemically etched substrate S on which the rear surface work damage-strained layer 51 and the CVD oxide film 52 are formed.

A liquid in which K ions and Na ions are included at the respective lowest concentrations possible is desirably used as an alkaline etching liquid since the K and Na ions contaminate a chemically etched substrate S; for example, an organic base etching liquid such as a liquid including a hydroxy organic compound can be employed. Among organic base etching liquids, the following aqueous solutions are preferably employed: aqueous solutions of tetramethyl ammonium hydroxide $((CH_3)_4NOH)$, hydrazine $(N_2H_4)$, ethylene diamine $(H_2NCH_2XCH_2NH_2)$ and pyrocatechol $(C_6H_4(OH)_3)$, singly or in combination.

The above described alkaline liquids have advantages in that the liquids do not contain much of K and Na ions and in addition, are excellent in etching performance: for example, an etching rate can be increased at 1 $\mu$m/min or higher, dissimilar to alkaline liquids such as a potassium hydroxide (KOH) aqueous solution and a sodium hydroxide (NaOH) aqueous solution. Note that, while, for example, in a case of aqueous ammonia, it is the same alkaline liquid of an inorganic type, an etching rate thereof is hard to increase higher than 1 $\mu$m/min.

In this example, etching on a chemically etched substrate was performed using tetramethyl ammonium hydroxide (hereinafter referred to as "TMAH").

TMAH is an etching liquid widely employed in an integrated circuit fabrication process as a developer for photoresist used in formation of an integrated circuit. TMAH has an etching rate in the range of 0.5 to 1.2 $\mu$M/min on silicon at temperature in the range of 70° C. to 90° C. Furthermore, in FIG. 14C, an etched-off thickness on the CVD oxide film 52 formed on a rear surface side of the chemically etched substrate S is of the order of 10 nm during the time that a front main surface Pa of the chemically etched substrate S is etched off by 10 $\mu$m; therefore, the etching with TMAH has substantially no influence on an auto-doping prevention effect of the CVD oxide film 52 generally formed to a thickness in the range of 300 nm to 500 nm.

Figure 14D:
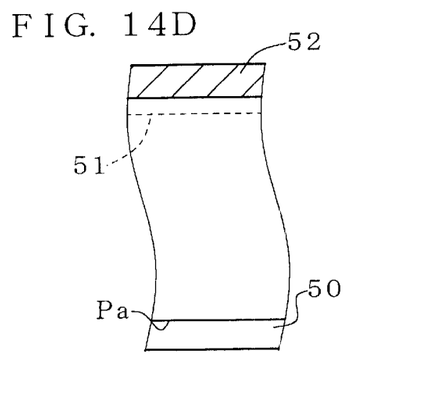
Figure 15:
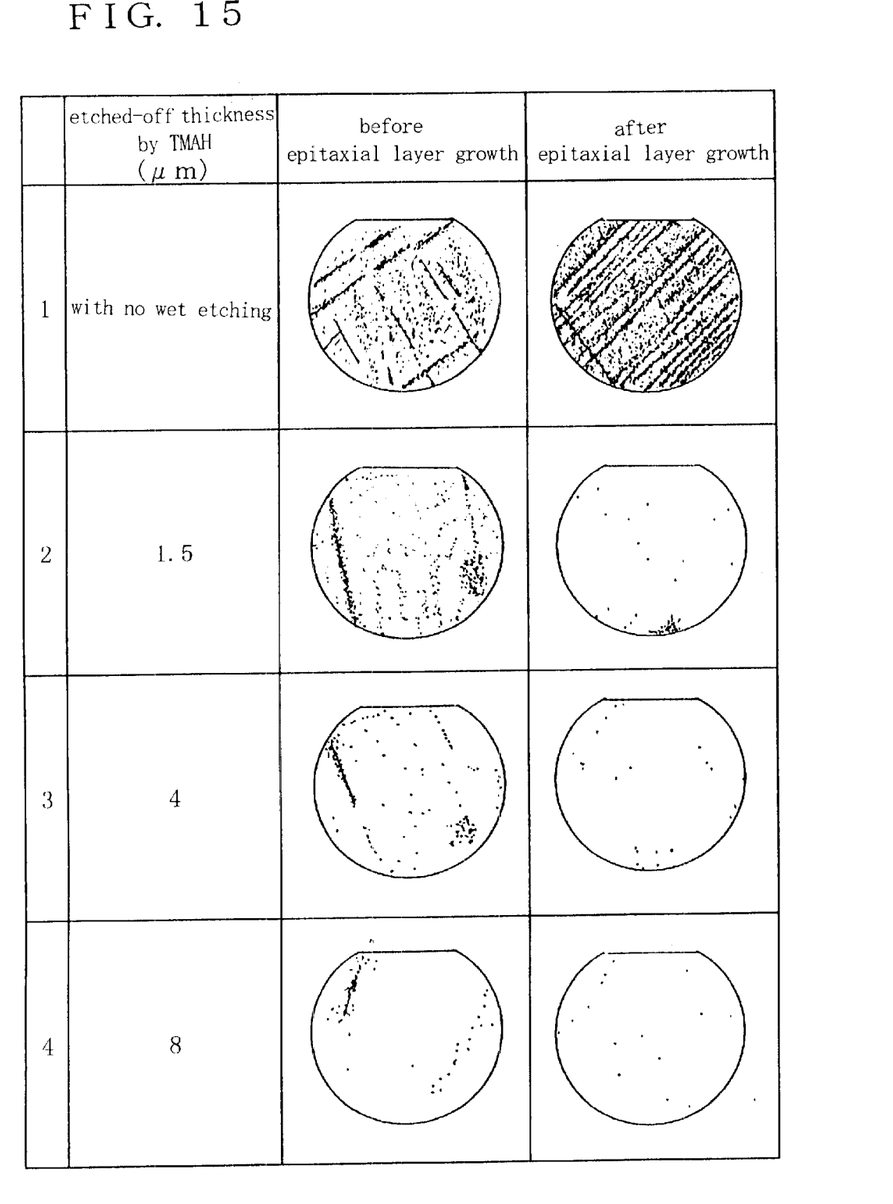
FIG. 15 is sketches showing empirical results of the third example conducted for confirming an effect of wet etching.

In this example, a TMAH solution of 25% in concentration was used and chemically etched substrates, on each of the rear surfaces of which a rear surface work damage-strained layer 51 and a CVD oxide film 52 had been formed, were exposed to the TMAH solution at a temperature of 80° C. to etch off by thicknesses of 1.5 $\mu$m, 4 $\mu$m and 8 $\mu$m. After the etching, all substrates etched off with the TMAH solution by the different thicknesses each maintained a glossiness of a front main surface thereof at 95% or higher. A epitaxial layer 50 was, as shown in FIG. 14D, grown in vapor phase on the front main surface Pa of each of the etched substrates each with the rear surface work damage-strained layer 51 and the CVD film 52. As a result, an as-grown front main surface of the epitaxial layer 50 on each of the substrates maintained a glossiness thereof at 95% or higher. In parallel to this example, as a comparative example, an epitaxial layer 50' was also grown in vapor phase on each of chemically etched substrates on which no etching with the alkaline etching liquid was applied (FIGS. 14A and 14B). Visual observation was performed on a front main surface of each of substrates S under illumination with halogen light before and after vapor phase growth of an epitaxial layer. Since damages, defects and others produced on a substrate S each provide a reflecting region like a bright spot (hereinafter referred to as a bright spot region) reflecting halogen light at the damage and the like defects; by counting the number of bright spot regions, a state of formation of damages, defects or the like can be grasped. FIG. 15 is a sketch of a distribution state of bright spot regions generated on each substrate, wherein a bright spot region is expressed with a black dot.

It can be seen from the sketches of the substrates before growth of epitaxial layers that as an etched-off thickness by an alkaline etching liquid increases to be in the range of 1.5 $\mu$m to 8 $\mu$m, the number of bright spot regions decreases apparently and damages observed on the chemically etched substrates also decrease in number. It can be further seen from the sketches of the epitaxial layers after the vapor phase growth on substrates exposed to the etching liquid that, with increase in the etched-off thickness, the number of bright spot regions on an epitaxial layer greatly decreases and formation of stacking faults therein is also restricted. As a result of a further study, it was found that an etched-off thickness by an alkaline etching liquid is preferably in the range of 0.5 $\mu$m to 10 $\mu$m, both limits included. When an etched-off thickness is less than 0.5 $\mu$m, the number of stacking faults observed in an epitaxial layer is not reduced compared with the number of damages observed on a corresponding chemically etched substrate. On the other hand, even when an etched-off thickness is increased more than 10 $\mu$m, the number of stacking faults in an epitaxial layer was not reduced any longer with increase in etched-off thickness.

Note that in comparative examples obtained by forming an epitaxial layer on each of chemically etched substrates not exposed to the alkaline etching, it was found that the number of bright spot regions observed in an epitaxial layer greatly increases compared with the number of damages observed on a corresponding chemically etched substrate before growth of an epitaxial layer.

Next, a damage eliminating step can also be performed in a vapor phase etching step. The vapor phase etching step is preferably performed using hydrogen chloride gas since an etching effect is high. Moreover, it is further effective to perform the vapor phase etching step after the wet etching step from the viewpoint of elimination of damage on a substrate and prevention of defect generation during epitaxial growth. In order to confirm the etching effect of the vapor phase etching step, the following experiment was conducted: That is, substrates were subjected to wet etching with TMAH used in the experiments shown in FIG. 15 (wherein No. 1 specimen was not treated by wet etching)

and thus wet-etched substrates were etched off to a thickness of 1 μm by vapor phase etching with hydrogen chloride gas in a hydrogen gas atmosphere at 1150° in a growth furnace of a vapor phase growth apparatus, followed by vapor phase growth of an epitaxial layer on each substrate.

Figure 16:
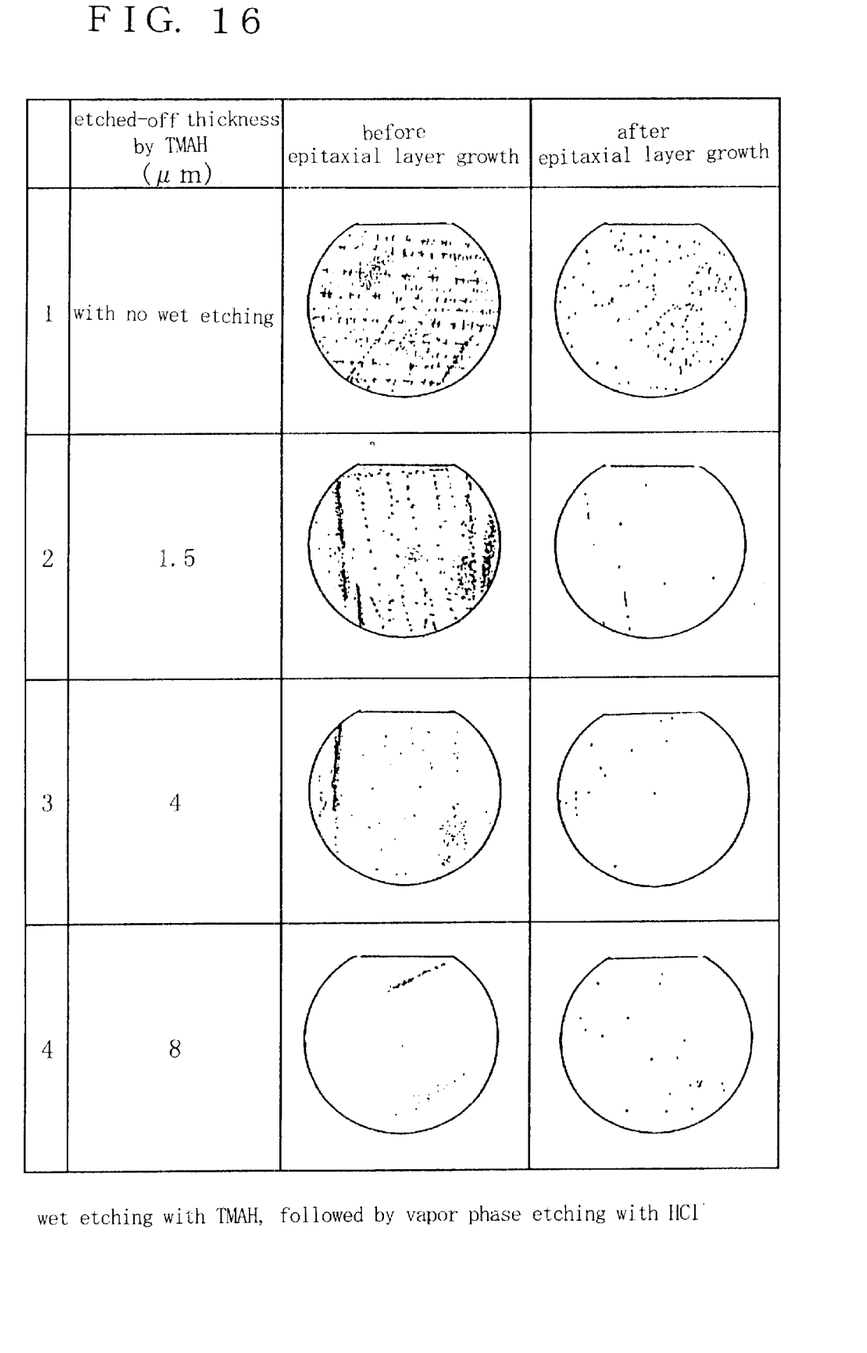
FIG. 16 is sketches showing empirical results of the third example conducted for confirming a synergetic effect of combined wet etching and vapor phase etching.

FIG. 16 is sketches showing observation results under halogen light illumination on front main surfaces of the respective substrates after the vapor phase etching with hydrogen chloride (before the epitaxial layer growth) and after the epitaxial layer growth. It is found from the observation results that when an epitaxial layer is grown in vapor phase on a chemically etched substrate which has been etched with hydrogen chloride on a front main surface thereof, then the number of bright spot regions observed on the epitaxial layer, that is the number of stacking faults generated therein, is apparently reduced, as compared the number of damages observed on a corresponding chemically etched substrate and such observation result applies to the case where a substrate is not etched with TMAH (No. 1 specimen) either. Furthermore, it is also understood from results on Nos. 2 to 4 specimens, damage elimination and suppression of defect generation can be effectively and stably realized by performing wet etching with TMAH and vapor phase etching with hydrogen chloride gas in both ways.

In addition, it was found from further study that vapor phase etching with hydrogen chloride gas is preferably performed such that an etched-off thickness on a front main surface of a chemically etched substrate is adjusted in the range of 0.3 μm to 5 μm, both limits included. When an etched-off thickness is smaller than 0.3 μm, almost no etching effect is available. When an etched-off thickness is larger than 5 μm, a dopant in a chemically etched substrate is excessively released from a front main surface into a vapor phase therearound; therefore an auto-doping effect in vapor phase growth exerts a great influence on an epitaxial layer, with the result that a problem arises since a resistivity distribution across the surface of the epitaxial layer, in a case, spreads over a range as large as not to be allowable.

Note that a damage eliminating step can also successfully be performed in a heat treatment in a hydrogen or nitrogen atmosphere at 1200° C. or higher. That is, by performing such a heat treatment, strain and defects introduced by damage are relaxed or shrunk and as a result, defects can be effectively reduced similar to the case of the wet etching or the vapor phase etching.

In a condition that a heat treatment temperature is lower than 1200° C., however, the defect reducing effect cannot be exerted sufficiently. On the other hand, even if a heat treatment temperature is raised to a temperature higher than 1300° C., no great improvement on the damage eliminating effect is expected and besides, additional cost is imposed on a heat treatment furnace due to its high temperature specifications or a lifetime of a heat treatment furnace is shortened, all of which result in a problem of economy with ease.

Note that when a damage eliminating step is performed by the heat treatment as described above, a case arises where an oxide film or a nitride film is formed on a front main surface of a chemically etched substrate. In this case, it is necessary to eliminate the oxide film or the nitride film before vapor phase growth of an epitaxial layer. As an elimination method for the oxide film, a method is available in which only a front main surface of the substrate is selectively put into contact with an etching liquid for oxide film elimination (for example, a solution containing hydrofluoric acid). To be concrete, methods can be exemplified: a method in which only a front main surface of a substrate is put into contact with a surface of an etching liquid while holding the substrate in place, a method in which an etching liquid impregnated in a liquid holding member such as absorbent cotton is applied to the front main surface, and a method in which a rear surface of a substrate is coated with a resin film or the like, or a soft and flexible resin sheet having some adhesive force (for example, a polyvinyl chloride resin sheet) is fastened on a rear surface of a substrate, and the substrate in the state is immersed in an etching liquid.

On the other hand, as an eliminating method for a nitride film, a method can be exemplified in which a substrate on which the nitride film is formed is immersed in a hot phosphoric acid in a boiling state.

What is claimed is:

1. A silicon epitaxial wafer obtained by forming a silicon single-crystal thin film on a chemically etched silicon single-crystal substrate with a surface glossiness of 95% or higher.

2. A production process for a silicon epitaxial wafer in which a silicon single-crystal thin film with a surface glossiness of 95% or higher is formed on a chemically etched substrate obtained by chemically etching a to-be-treated silicon single-crystal substrate.

3. A production process for a silicon epitaxial wafer according to claim 2, wherein a surface glossiness of the chemically etched substrate is increased to 95% or higher by the chemical etching treatment.

4. A production process for a silicon epitaxial wafer according to claim 2, wherein the chemical etching treatment is performed using an acid etching liquid and an etching time is set such that a substrate surface roughness remains unchanged but comes to show almost a constant value regardless of elapse of an etching time.

5. A production process for a silicon epitaxial wafer according to claim 3, wherein the chemical etching treatment is performed using an acid etching liquid and an etching time is set such that a substrate surface roughness remains unchanged but come to show almost a constant value regardless of elapse of an etching time.

6. A production process for a silicon epitaxial wafer according to claim 4, wherein the to-be-treated silicon single-crystal substrate is of an n-type and an etching removal on the to-be-treated silicon single-crystal substrate is 60 μm or more.

7. A production process for a silicon epitaxial wafer according to claim 5, wherein the to-be-treated silicon single-crystal substrate is of an n-type and an etching removal on the to-be-treated silicon single-crystal substrate is 60 μm or more.

8. A production process for a silicon epitaxial wafer according to claim 4, wherein an etching removal on the to-be-treated silicon single-crystal substrate is 70 μm or more.

9. A production process for a silicon epitaxial wafer according to claim 5, wherein an etching removal on the to-be-treated silicon single-crystal substrate is 70 μm or more.

10. A production process for a silicon epitaxial wafer according to claim 2, wherein when a rear surface side of the chemically etched substrate receives a processing, while supporting the chemically etched substrate on which the silicon single-crystal thin film is formed with a support by a front main surface side thereof; a contact blocking member for preventing direct contact between the front main-surface of the chemically etched substrate and the support is interposed therebetween.

11. A production process for a silicon epitaxial wafer according to claim 10, wherein at least a contact portion of the contact blocking member with the front main surface is made from a material softer than a silicon single-crystal.

12. A production process for a silicon epitaxial wafer according to claim 10, wherein the contact blocking member is made from a material softer than a silicon single-crystal and is a coat layer coating the front main surface.

13. A production process for a silicon epitaxial wafer according to claim 10, wherein the contact blocking member is a member supporting the chemically etched substrate in contact with an outer peripheral surface of the substrate and/or an outer peripheral edge of the front main surface thereof while preventing direct contact between the front main surface and the support.

14. A production process for a silicon epitaxial wafer according to claim 10, wherein the contact blocking member is a compressed gas, and the compressed gas is made to blow to the front main surface of the chemically etched substrate and thereby, supports it.

15. A production process for a silicon epitaxial wafer according to claim 2, comprising:
   a rear surface side processing step of performing a processing on a rear surface side of the chemically etched substrate while supporting the chemically etched substrate on which a silicon single-crystal thin film is formed by a front main surface thereof with a support in contact with the front main surface thereof; a damage eliminating step of eliminating damage produced on the front main surface of the chemically etched substrate by contact of the support therewith; and
   a vapor phase growth step of forming a silicon single-crystal thin film on the front main surface of the chemically etched substrate.

16. A production process for a silicon epitaxial wafer according to claim 15, wherein the damage eliminating step includes a wet etching step using an alkaline etching liquid.

17. A production process for a silicon epitaxial wafer according to claim 16, wherein the alkaline etching liquid is one aqueous solution selected from the group consisting of aqueous solutions of tetramethyl ammonium hydroxide, hydrazine, ethylene diamine and pyrocatechol, singly or in combination.

18. A production process for a silicon epitaxial wafer according to claim 15, wherein in the damage eliminating step, an etched-off thickness on the chemically etched substrate is in the range of 0.5 $\mu$m to 10 $\mu$m, both limits included.

19. A production process for a silicon epitaxial wafer according to claim 16, wherein in the damage eliminating step, an etched-off thickness on the chemically etched substrate is in the range of 0.5 $\mu$m to 10 $\mu$m, both limits included.

20. A production process for a silicon epitaxial wafer according to claim 17, wherein in the damage eliminating step, an etched-off thickness on the chemically etched substrate is in the range of 0.5 $\mu$m, to 10 $\mu$m, both limits included.

21. A production process for a silicon epitaxial wafer according to claim 15, wherein in the damage eliminating step, an etched-off thickness on the chemically etched substrate is in the range of 1.5 $\mu$m to 8 $\mu$m, both limits included.

22. A production process for a silicon epitaxial wafer according to claim 16, wherein in the damage eliminating step, an etched-off thickness on the chemically etched substrate is in the range of 1.5 $\mu$m to 8 $\mu$m, both limits included.

23. A production process for a silicon epitaxial wafer according to claim 17, wherein in the damage eliminating step, an etched-off thickness on the chemically etched substrate is in the range of 1.5 $\mu$m to 8 $\mu$m, both limits included.

24. A production process for a silicon epitaxial wafer according to claim 15, wherein in the damage eliminating step, a vapor phase etching step using hydrogen chloride gas is included.

25. A production process for a silicon epitaxial wafer according to claim 24, wherein in the damage eliminating step, the vapor phase etching step is performed after the wet etching step is performed.

26. A production process for a silicon epitaxial wafer according to claim 24, wherein in the vapor phase etching step an etched-off thickness on a front main surface of the chemically etched substrate is in the range of 0.3 $\mu$m to 5 $\mu$m, both limits included.

27. A production process for a silicon epitaxial wafer according to claim 25, wherein in the vapor phase etching step, an etched-off thickness on a front main surface of the chemically etched substrate is in the range of 0.3 $\mu$m to 5 $\mu$m, both limits included.

28. A production process for a silicon epitaxial wafer according to claim 15, wherein the damage eliminating step includes a heat treatment heat-treating and chemically etched substrate in a hydrogen or nitrogen atmosphere at a temperature in the range of 1200° to 1300° C.

* * * * *

UNITED STATES PATENT AND TRADEMARK OFFICE
CERTIFICATE OF CORRECTION

PATENT NO.    : 6,458,205 B1
DATED         : October 1, 2002
INVENTOR(S)   : Koichi Hasegawa and Yuji Okubo It is certified that error appears in the above-identified patent and that said Letters Patent is hereby corrected as shown below:

Column 14,
Line 65, delete "main-surface" and substitute therefore -- main surface --.

Column 16,
Line 9, after "0.5" delete "$\mu$m," and substitute therefore -- $\mu$m --.

Signed and Sealed this

Fourth Day of March, 2003

JAMES E. ROGAN
*Director of the United States Patent and Trademark Office*